(12) United States Patent
Hargreaves et al.

(10) Patent No.: US 7,777,486 B2
(45) Date of Patent: Aug. 17, 2010

(54) MAGNETIC RESONANCE IMAGING WITH BIPOLAR MULTI-ECHO SEQUENCES

(75) Inventors: Brian Hargreaves, Menlo Park, CA (US); Wenmiao Lu, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 11/854,687

(22) Filed: Sep. 13, 2007

(65) Prior Publication Data

US 2009/0072826 A1    Mar. 19, 2009

(51) Int. Cl.
*G01V 3/00* (2006.01)
(52) U.S. Cl. ..................................... 324/309
(58) Field of Classification Search ......... 324/300–322; 600/410–435
See application file for complete search history.

(56) References Cited

U.S. PATENT DOCUMENTS

| | | | |
|---|---|---|---|
| 5,485,085 A | 1/1996 | Sumanaweera et al. | |
| 5,722,409 A * | 3/1998 | Kuhara et al. | 600/410 |
| 5,751,145 A | 5/1998 | Shimizu | |
| 5,909,119 A | 6/1999 | Zhang et al. | |
| 5,923,168 A * | 7/1999 | Zhou et al. | 324/309 |
| 6,064,205 A * | 5/2000 | Zhou et al. | 324/309 |
| 6,307,368 B1 | 10/2001 | Vasanawala et al. | |
| 6,407,700 B1 | 6/2002 | Giffard | |
| 6,459,922 B1 | 10/2002 | Zhang | |
| 6,489,770 B1 * | 12/2002 | Hirata | 324/320 |
| 6,549,667 B1 | 4/2003 | Fukuda et al. | |
| 6,697,507 B1 * | 2/2004 | Chapman | 382/131 |
| 6,700,374 B1 * | 3/2004 | Wu et al. | 324/312 |
| 6,703,835 B2 | 3/2004 | Patch et al. | |
| 6,856,134 B1 | 2/2005 | Reeder et al. | |
| 7,408,346 B2 * | 8/2008 | Szyperski et al. | 324/307 |

OTHER PUBLICATIONS

Press WH, Teukolsky AS, Vetterling WT, Flannery BP, "Numerical Recipes in C: The Art of Scientific Computing", Cambridge University Press, New York, NY, $2^{nd}$ Ed., pp. 397-402, 1988-1992.

Yu H, Reeder SB, Shimakawa A, Brittain JH, Pelc NJ, "Field Map Estimation With a Region Growning Scheme for Iterative 3-Point Water-Fat Decomposition", Magn. Reson. Med., 54:1032-1039, 2005.

Lu, Gold GE, Yu H, Hargreaves BA, "Multi-Resolution Non-Iterative Field Map Estimation for Water and Fat Separation", Proceedings of the $15^{th}$ Annual Meeting of ISMRM, Berlin, 2007, p. 1638.

(Continued)

*Primary Examiner*—Brij B Shrivastav
*Assistant Examiner*—Dixomara Vargas
(74) *Attorney, Agent, or Firm*—Beyer Law Group LLP

(57) ABSTRACT

A method for magnetic resonance imaging (MRI) is provided. A magnetic resonance excitation is provided. A plurality of k-space echoes is acquired bi-directionally wherein at least one echo is an even echo acquired in a first direction and at least one echo is an odd echo acquired in a second direction opposite from the first direction. K-space echo realignment is corrected between the even and odd echoes. Field inhomogeneity induced artifacts are corrected. Chemical shift induced artifacts between at least two species are corrected.

19 Claims, 9 Drawing Sheets

OTHER PUBLICATIONS

Reeder SB, Pineda AR, Wen Z, Shimakawa A, Yu H, Brittain JH, Gold GE, Beaulieu CH, and Pelc NJ, "Iterative Decomposition of Water and Fat with Echo Asymmetry and Least-Squares Estimation IDEA: Application with Fast Spin-Echo Imaging", Magn. Reson. Med., 54:636-644, 2005.

Baek et al., "Two-dimensional reconstruction algorithm of an inverse-geometry volumetric CT system", Proceedings of SPIE Medical Imaging 2007: Physics of Medical Imaging, vol. 6510, 9 pages, Mar. 2007.

Lu et al., "Chemical Shift Correction in Bipolar Multi-Echo Sequences for Water-Fat Separation", Presented as a Poster at the Joint Annual Meeting ISMRM-ESMRMB, 2007.

Lustig et al., "Faster Imaging with Randomly Perturbed, Undersampled Spirals and ILI_1 Reconstruction", Proceedings of the ISMRM 13$^{th}$ Annual Meeting, p. 685, 2005.

* cited by examiner

MAGNETIC RESONANCE IMAGING WITH BIPOLAR MULTI-ECHO SEQUENCES

GOVERNMENT RIGHTS

This invention was made with Government support under contracts NIH-RR009784-11, NIH-EB002524-01, NIH-HL075803-01, and NIH 2P41RR009784-11 awarded by the National Institutes of Health. The Government has certain rights in this invention.

BACKGROUND OF THE INVENTION

This invention relates generally to magnetic resonance imaging (MRI), and more particularly, the invention relates to multi-echo MRI Magnetic resonance imaging (MRI) is a non-destructive method for the analysis of materials and is an approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During an MRI experiment, each nuclear spin responds to four different effects: precession about the main magnetic field, nutation about an axis perpendicular to the main field, and both transverse and longitudinal relaxation. In steady-state MRI experiments, a combination of these effects occurs periodically.

Reliable and uniform fat suppression is clinically important, as bright fat signals may obscure underlying pathology and degrade the diagnostic value of MR images. Compared to fat suppression methods based on spectrally-selective excitation and STIR (short-tau inversion recovery), multi-point water-fat separation methods based on chemical-shift induced phase differences are less susceptible to magnetic field inhomogeneities. In order to correct field inhomogeneities before water-fat separation, the latter group of methods often incurs long scan times to acquire multiple images for field map estimation. Long scan times result in suboptimal imaging efficiency and motion-induced artifacts, which prohibit routine clinical use of multi-point water-fat separation methods for many applications.

The problems due to long scan times are partially addressed by multi-echo sequences, which acquire multiple echoes in a single repetition. Multi-echo sequences have been used for water-fat separation in applications that require highly signal-to-noise ratio (SNR) efficient imaging, such as abdominal imaging and flow-independent angiography. However, the echo-spacings in multi-echo sequences are typically much longer than those in single-echo sequences. Long echo-spacings impair robustness of field map estimation, and hence result in less reliable water-fat separation. In other words, reliable water-fat separation with multi-echo sequences requires short echo-spacings. However, short echo-spacings dictate large receiver bandwidth and/or low spatial resolution, both of which cause a loss of SNR. Therefore, the application of multi-echo sequences to water-fat separation is still limited.

In some processes a plurality of scans in k-space are used. The scans are performed in the same direction, so between scans a fly-back gradient is used to return the scan parameters to an initial position or region.

SUMMARY OF THE INVENTION

In accordance with the invention, a method for magnetic resonance imaging (MRI) is provided. A magnetic resonance excitation is provided. A plurality of k-space echoes is acquired bi-directionally wherein at least one echo is an even echo acquired in a first direction and at least one echo is an odd echo acquired in a second direction opposite from the first direction. K-space echo realignment is corrected between the even and odd echoes. Field inhomogeneity induced artifacts are corrected. Chemical shift induced artifacts between at least two species are corrected.

In another manifestation of the invention a magnetic resonance imaging apparatus is provided. A magnetic resonance imaging excitation and detection system is provided. A controller is electrically connected to the magnetic resonance imaging excitation and detection system. The controller comprises a display, at least one processor, and computer readable media. The computer readable media comprises computer readable code for applying a magnetic resonance excitation, computer readable code for acquiring a plurality of k-space echoes bi-directionally wherein at least one echo is an even echo acquired in a first direction and at least one echo is an odd echo acquired in a second direction opposite from the first direction, computer readable code for correcting k-space echo realignment between the even and odd echoes, computer readable code for correcting field inhomogeneity induced artifacts, and computer readable code for correcting chemical shift induced artifacts between at least two species.

The invention and objects and features thereof will be more readily apparent from the following detailed description and appended claims when taken with the drawings.

DETAILED DESCRIPTION OF ILLUSTRATED EMBODIMENTS

Figure 1:
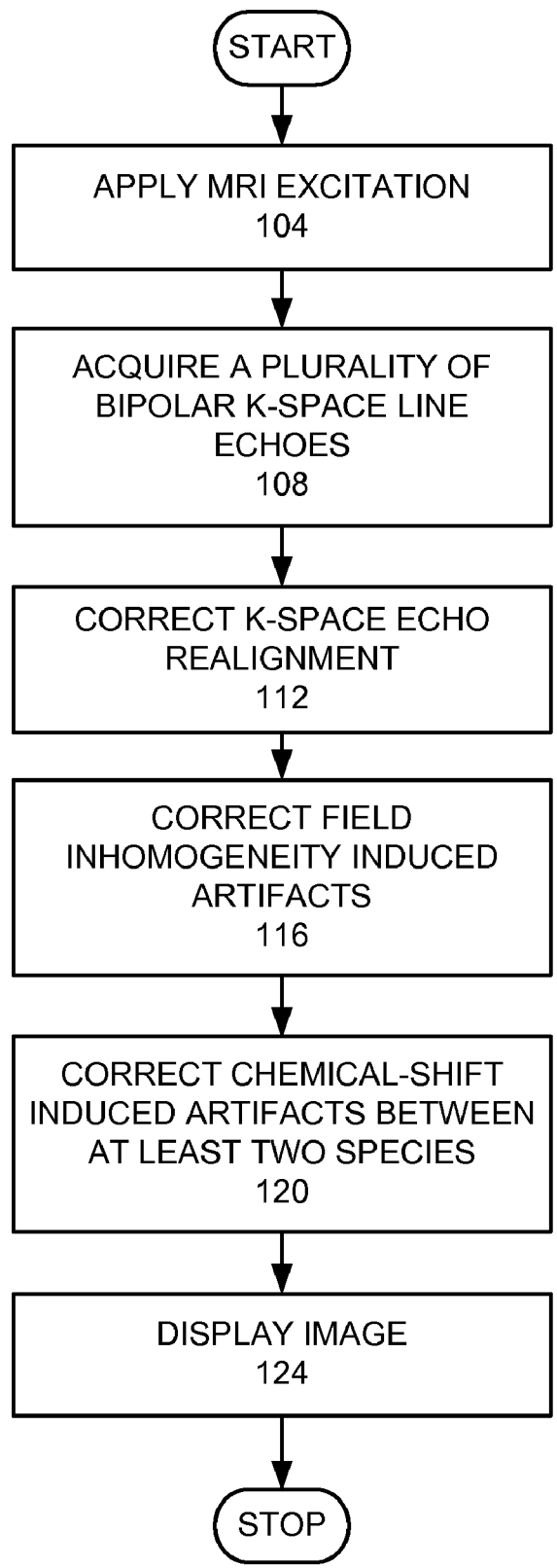
FIG. 1 is a high level flow chart of an example of the invention.

To increase MRI speeds, instead of scanning in the same direction and therefore requiring a fly-back gradient, an example of the invention provides bi-polar scanning (scanning in both directions (bi-directional)) and then provides corrections to reduce problems introduced by the bi-polar scan. To facilitate understanding, FIG. 1 is a high level flow chart of an example of the invention. At least one MRI excitation is applied (step 104). A plurality of bipolar k-space line echoes are acquired (step 108). K-space echo realignment is corrected (step 112). The field inhomogeneity induced artifacts are corrected (step 116). The chemical-shift induced artifacts between at least two species are corrected (step 120). An image is displayed (step 124).

EXAMPLES

Highly SNR-efficient imaging and robust water-fat separation can be achieved by replacing the fly-back gradients in standard multi-echo sequences with alternating readout gradients, which will be referred to as "bipolar" multi-echo sequences, where even and odd echoes are acquired with opposite readout polarities (i.e. opposite directions in k-space). The schematic diagram of a bipolar multi-echo gradient-echo (GRE) sequence is shown in FIG. 2.

Figure 2:
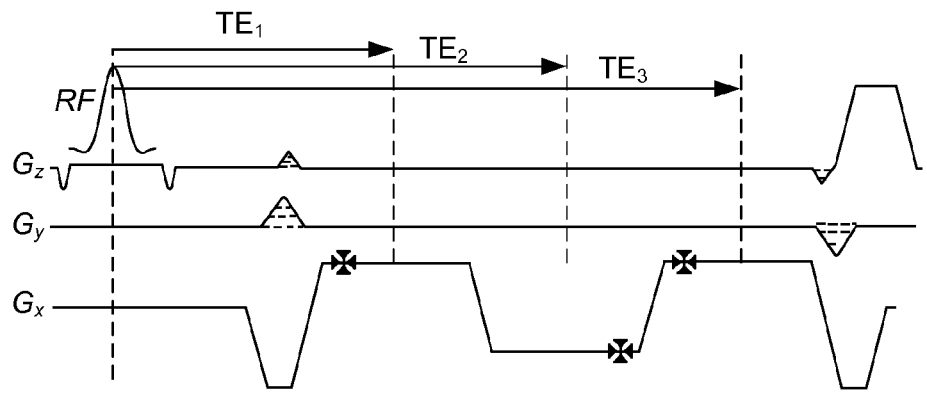
FIG. 2 illustrates a schematic diagram of a bipolar multi-echo gradient-echo (GRE) sequence

FIG. 2 is a schematic diagram of a bipolar multi-echo GRE sequence. The time instances when three k-space samples $S_n(k_x,k_y)$ (n=1, 2, 3) are acquired are marked with ✶symbols. Note that $(k_x,k_y)$ is the same for all three samples. As compared to standard multi-echo sequences, both echo-spacing ΔTE and repetition interval TR are significantly reduced in bipolar multi-echo sequences. The shortened ΔTE and TR offer many attractive advantages, such as short scan times, high SNR efficiency, robust field map estimation, and reduced motion-induced artifacts.

However, useful water-fat separation with bipolar multi-echo sequences needs to address the technical problems depicted in FIGS. 3*a-h*, namely k-space echo misalignment, field-inhomogeneity induced misregistration, and chemical-shift induced misregistration.

Figure 3:
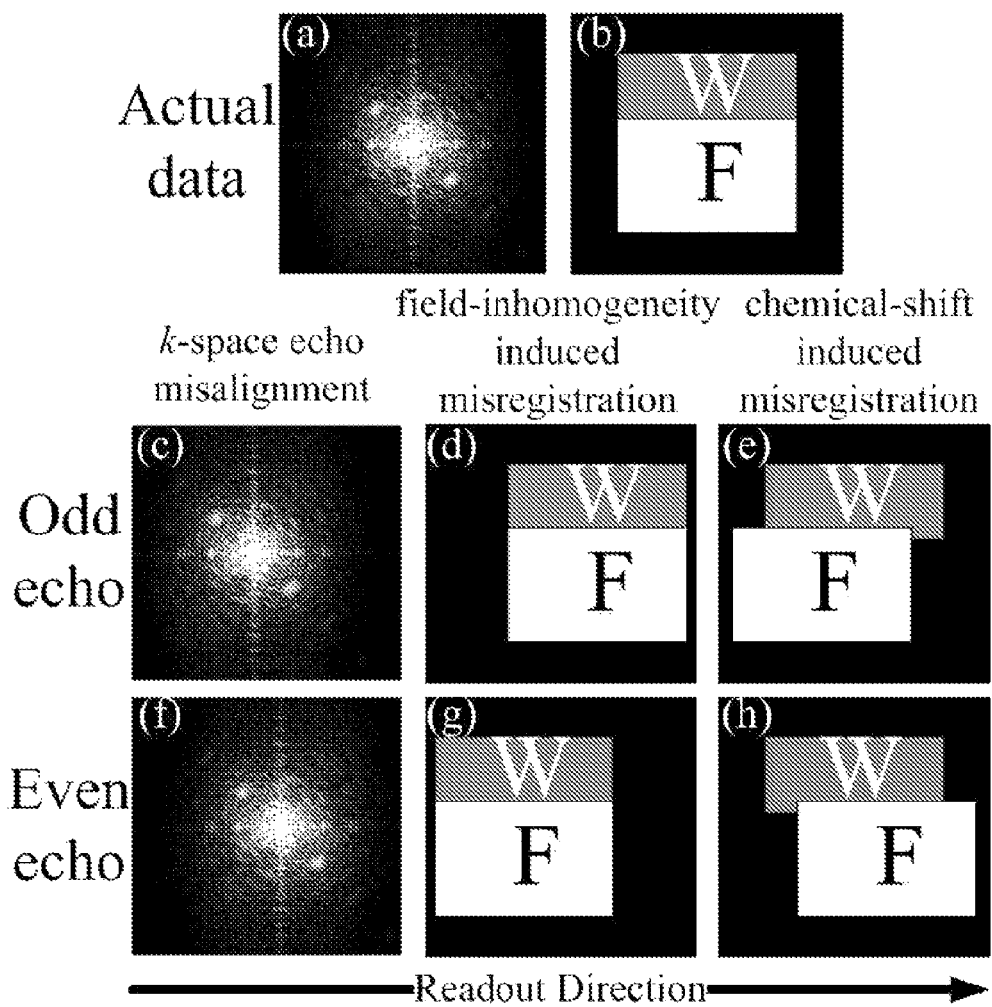
FIGS. 3a-h illustrates fat separation with bipolar multi-echo sequences technical problems

FIGS. 3*a-b* show the actual k-space data (FIG. 3*a*) of an image (FIG. 3*b*), in which fat(F) overlays water(W). FIGS. 3*c-h* illustrate the problems caused by the alternating readout gradients on odd and even echoes. FIGS. 3*a* vs. *c* and *f* show k-space echo misalignment due to gradient delay and eddy-current effects. FIGS. 3*b* vs. *d* and *g* show that field-inhomogeneity induced misregistration occurs in the opposite directions between odd and even echoes. FIGS. 3*b* vs. *e* and *h* show that chemical-shift induced misregistration, which presents as a relative shift between water and fat, occurs in opposite readout directions between odd and even echoes.

This example of the invention provides solutions to all three problems, which are briefly summarized as follows:

1. Correction of k-space echo misalignment (step 112): Gradient delay and eddy-current effects result in delays in echo acquisitions. After time reversal of even echoes to correct the gradient polarity reversal, the delays in echo acquisition cause k-space echo misalignment, as depicted in FIGS. 3*a* vs. *c* and *f*. The k-space echo misalignment leads to inconsistent linear phase shifts between even and odd echo images, which disrupt chemical-shift induced phase differences. This causes failure in field map estimation and the subsequent water-fat separation. In this example an automated post-processing method shifts the k-space data of even echoes to align with that of odd echoes; the idea is to maximize the cross-correlation coefficient between even and odd echo k-space data. Preferably, this step is performed in k-space.

2. Correction of field-inhomogeneity induced misregistration (step 116): The gradient polarity reversal causes field-inhomogeneity induced misregistration to occur in opposite readout directions between even and odd echoes, as shown in FIGS. 3*b* vs. *d* and *g*. Field-inhomogeneity induced misregistration is spatially slow-varying, and is identical for water and fat. In this example, an image warping method corrects such misregistration by re-sampling the image data with the aid of a low-resolution field map estimate. Preferably, this step is performed in image space.

3. Correction of chemical-shift induced misregistration (step 120): Due to the alternating readout gradients, chemical-shift induced misregistration, which presents as a relative shift between water and fat, occurs in opposite readout directions for even and odd echoes, as shown in FIGS. 3*b* vs. *e* and *h*. As chemical-shift induced misregistration is species-dependent but spatially-invariant, water-fat separation is performed in k-space. The k-space water-fat separation effectively eliminates the phase caused by the chemical shift, hence correcting any artifacts in separated water/fat images due to the chemical-shift induced misregistration. Preferably, this step is performed in k-space.

Theory

To avoid an overly complex signal model, it is assumed in this section that the k-space echo misalignment has been corrected for (the correction method will be described later in Methods section-A). Let $I_n$ denote the image acquired at the $n^{th}$ echo time, $TE_n$. For example, n=1, 2, 3 for three-point water-fat separation methods. Each pixel at the location (x, y) of the acquired image, $I_n(x, y)$, has a complex signal value that depends on the corresponding vowels' proton density, composition of chemical species, field inhomogeneities, and the echo time $TE_n$. When the echo times are much shorter than the $T_2$s of tissues present, the magnitude difference due to the $T_2$ decay between acquisitions can be ignored. In addition to the aforementioned factors, the following signal model takes into account the effects of the alternating readout gradients: (assume=1, 2, and two chemical species, water and fat)

$$I_n(x, y) = \begin{cases} W(x+\Delta x_{fm}, y)e^{i2\pi\psi(x+\Delta x_{fm},y)TE_n} + F(x+\Delta x_{fm}+\Delta x_{cs}, y)e^{i2\pi(\Delta f+\psi(x+\Delta x_{fm}+\Delta x_{cs},y))TE_n} \forall n=1,3 \\ W(x-\Delta x_{fm}, y)e^{i2\pi\psi(x-\Delta x_{fm},y)TE_n} + F(x-\Delta x_{fm}-\Delta x_{cs}, y)e^{i2\pi(\Delta f+\psi(x-\Delta x_{fm}-\Delta x_{cs},y))TE_n} \forall n=2 \end{cases}$$

where $W(x, y)$ and $F(x, y)$ are complex water and fat signal values, $\Delta f$ is the chemical shift between water and fat ($\Delta f \approx 220$ Hz at 1.5 T), and $\psi(x, y)$ is an unknown field map value (mainly due to $B_0$ field inhomogeneities). The readout direction is assumed to be along x-axis; $\Delta x_{fm}$ and $\Delta x_{cs}$ are the signal shifts along x-axis due to local field inhomogeneities and the chemical shift, respectively. Both $\Delta x_{fm}$ and $\Delta x_{cs}$ can be computed in units of pixels by $$\Delta x_{fm}(x, y) = \frac{\psi(x, y)}{BW_{pixel}}, \quad \Delta x_{cs} = \frac{\Delta f}{BW_{pixel}}, \quad (1)$$

where $BW_{pixel}$ is readout bandwidth per pixel. For example, with readout bandwidth $\pm 41$ kHz and acquisition matrix $256 \times 256$, $BW_{pixel} = 320.3$ Hz/pixel. Note that $\Delta x_{cs}$, which is not spatially varying, is solely determined by the chemical shift $\Delta f$ and readout bandwidth per pixel. Conversely, $\Delta x_{fm}(x, y)$ is the same for water and fat, but is spatially dependent on the field map value $\psi(x, y)$. The above signal model can be simplified based on the smoothly varying nature of field maps; i.e., $\psi(x,y) \approx \psi(x \pm \Delta x_{fm}) \psi(x \pm (\Delta x_{fm} + \Delta x_{cs}))$. This results in the following simplified signal model:

$$I_n(x, y) = \begin{cases} (W(x + \Delta x_{fm}, y) + F(x + \Delta x_{fm} + \Delta x_{cs}, y))e^{i2\pi \Delta fTE_n} e^{i2\pi \psi(x,y)TE_n} \forall n = 1, 3 \\ (W(x - \Delta x_{fm}, y) + F(x - \Delta x_{fm} - \Delta x_{cs}, y))e^{i2\pi \Delta fTE_n} e^{i2\pi \psi(x,y)TE_n} \forall n = 2 \end{cases} \quad (2)$$

With the simplified signal model, water-fat separation is still hindered by the misregistrations $\pm \Delta x_{fm}$ and $\pm \Delta x_{cs}$ across the images 11, 12, and 13. Considering a conservative imaging case at 1.5 T with bandwidth $\pm 41$ kHz ($BW_{pixel}$ 320 Hz/pixel for 256 256 matrix), $\pm \Delta x_{cs}$ gives 1.3-pixel shift for fat signal between even and odd echoes. When directly applying existing multi-point water-fat separation methods, both $\pm \Delta x_{cs}$ and $\pm \Delta x_{fm}$ lead to obtrusive artifacts in separated water and fat images.

Methods

As the signal models described in the Theory section do not account for the k-space echo misalignment due to system delays and the alternating readout gradients, a method that automatically corrects the k-space echo misalignment is first described. After correcting the k-space echo misalignment, the field map is estimated from low-resolution image data and correct the artifacts induced by field inhomogeneities. Finally, a k-space separation method is presented that eliminates chemical-shift induced artifacts in separated water/fat images.

A. Correction of k-space Echo Misalignment

Bipolar multi-echo sequences acquire the k-space lines of even and odd echoes in opposite directions. This requires that the k-space data of even echoes must be flipped along the readout direction such that all the k-space lines (and thus the image lines) point in the same direction. After flipping even echoes, the k-space data between even and odd echoes are usually misaligned due to gradient delay and eddy-current effects. The k-space echo misalignment, generally independent of scan subjects, is commonly seen with echo-planar imaging (EPI) sequences, where the correction requires calibration scans.

The k-space misalignment results in inconsistent linear phase between even and odd echoes. To correct for the inconsistent linear phase, the phase of an even-echo image needs to be compensated with linear phase ramp along the readout direction. Specifically, linear phase ramp of gradient $\alpha$ along x-axis is given by $e^{i\alpha x}$, which shifts k-space data along the readout direction. As one sample delay in k-space corresponds to $2\pi$ linear phase shift across the readout direction in image domain, the k-space sample delay corresponding to linear phase ramp can be calculated accordingly. For example, given $256 \times 256$ matrix and $=-0.015$, the k-space sample shift $\delta kx$ is given by $-0.6112$ samples.

The correction of the k-space misalignment requires searching for the optimal gradient of the linear phase ramp, which results in the best k-space alignment between echoes. The goodness of k-space echo alignment can be measured in terms of cross-correlation coefficient $\rho$ between k-space data of even and odd echoes. In the case of three echoes, denote the vectorized k-space data of three echoes as K1, K2, K3; the cross-correlation coefficient is given by $$\rho = \frac{|\vec{K}_1^* \vec{K}_2|}{|\vec{K}_1| \cdot |\vec{K}_2|} + \frac{|\vec{K}_3^* \vec{K}_2|}{|\vec{K}_3| \cdot |\vec{K}_2|}, \quad (3)$$

where the superscript * indicates conjugate transpose. The larger the cross-correlation coefficient $\rho$, the better the k-space echo alignment. That is, the optimal linear phase gradient a maximizes the coefficient $\rho$. For most calibrated scanners, the k-space delay between echoes is well under a few samples; hence it is normally sufficient to search for within limited interval. For example, the interval $[-0.1, 0]$ (radians/pixel) with acquisition matrix $256 \times 256$ accounts for up to 4-sample shift in k-space. Inside this search interval, the optimal gradient can be found efficiently using one-dimensional search algorithm, such as golden section or gradient ascent, which incurs very small computational overhead Such a computational process is described in Press W H, Teukolsky S A, Vetterling W T, Flannery B P, "Numerical Recipes in C," Cambridge University Press, New York, N.Y., $2^{nd}$ ed. 1994, which is incorporated by reference.

B. Correction of Field-Inhomogeneity Induced Misregistration

After correcting the k-space echo misalignment, the signal model has been simplified as shown in Eq. 2. In this section, the fact that field maps are smoothly varying is further exploited, and hence can be computed from low-resolution image data. The low-resolution image data is obtained by low-pass filtering the k-space data along the readout direction with Kaiser window. For N readout samples, the Kaiser window, $\{wl\}_{l=0, \ldots, N-1}$, is given by $$w_l = \frac{I_0(\pi\alpha\sqrt{1-\left(\frac{2l}{N}-1\right)^2})}{I_0(\pi\beta)}, \quad (4)$$

where $I_0$ is the zeroth order modified Bessel function of the first kind, and $\beta$ is a real number that determines the shape of the window. The larger the magnitude of $\beta$, the narrower the window is. The window is chosen to achieve good tradeoff between maintaining sufficient spatial information for field map estimation and suppressing the misregistrations $\Delta x_{fm}$ and $\Delta x_{cs}$. In this implementation, the window is chosen to reduce image resolution by roughly two-thirds, and effectively smear the misregistrations in the low-resolution image data.

Subsequently, a field map $\psi$ is obtained from the low-resolution image data using multipoint field map estimation method. Such field map estimations are described in Yu H, Reeder S B, Shimakawa A, Brittain J H, Pelc N J, "Field Map Estimation With a Region Growing Scheme For Iterative 3-Point Water-Fat Decomposition," Magn. Reson. Med. 2005; 54:1032-1039 and in Lu @, Gold G E, Yu H, Hargreaves B A, "Multi-Resolution Non-Iterative Field Map Estimation For Water and Fat Separation," Proceedings of the 15th Annual Meeting of ISMRM, Berlin 2007. p. 1638. With the aid of the field map, the effects due to field inhomogeneities can be removed. First, the phase factor $e^{i2\pi\psi TE_n}$ (n=1, 2, 3) in Eq. 2 are demodulated from the three echo images. Second, the field-inhomogeneity induced misregistration can be corrected by an image warping procedure. As $\Delta x_{fm}(x,y)$ is identical for both water and fat, the image warping re-samples the $I(x\pm\Delta xfm,y)$ from up-sampled image data. Specifically, the up-sampling is done by zero-padding the k-space data, and the re-sampled images are generated by $$I'_n(x, y) = \begin{cases} I_n(x - \Delta x_{fm}, y) & \forall n = 1, 3 \\ I_n(x + \Delta x_{fm}, y) & \forall n = 2. \end{cases} \quad (5)$$

C. Correction of Chemical-Shift Induced Misregistration

After correction of the phase factor and the field-inhomogeneity induced misregistration, a simpler signal model results as follows:

$$I_n(x, y) = \begin{cases} W(x, y) + F(x + \Delta x_{cs}, y)e^{i2\pi\Delta f TE_n} & \forall n = 1, 3 \\ W(x, y) + F(x - \Delta x_{cs}, y)e^{i2\pi\Delta f TE_n} & \forall n = 2 \end{cases} \quad (6)$$

Figure 4:
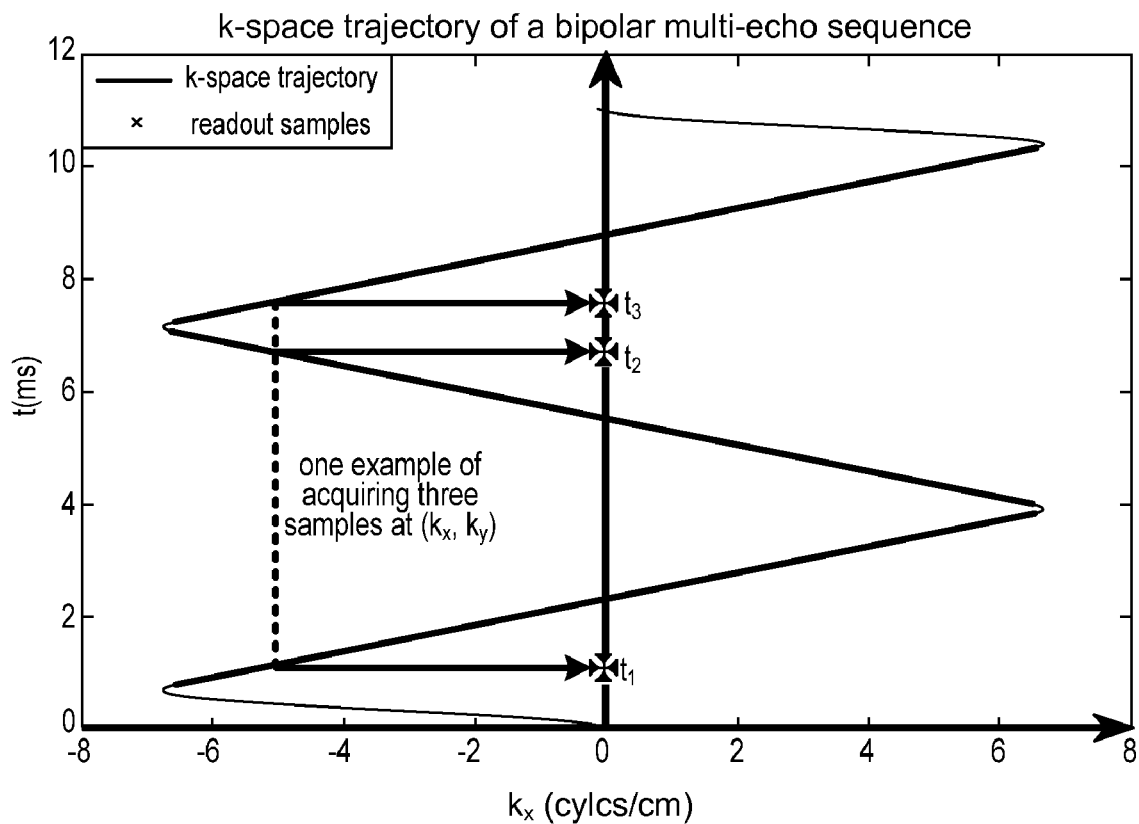
FIG. 4 is a schematic view of a k-space sampling pattern of the bipolar sequence shown in FIG. 2.

When the signal model in Eq. 6 is transformed back to k-space, the results are $$\underbrace{\begin{pmatrix} S_1(k_x, k_y) \\ S_2(k_x, k_y) \\ S_3(k_x, k_y) \end{pmatrix}}_{s} = \underbrace{\begin{pmatrix} 1 & e^{i2\pi\Delta f t_1(k_x,k_y)} \\ 1 & e^{i2\pi\Delta f t_2(k_x,k_y)} \\ 1 & e^{i2\pi\Delta f t_3(k_x,k_y)} \end{pmatrix}}_{A} \underbrace{\begin{pmatrix} S_W(k_x, k_y) \\ S_F(k_x, k_y) \end{pmatrix}}_{\Gamma} \quad (7)$$

where $SW(k_x,k_y)$ and $SF(k_x,k_y)$ are water and fat k-space samples, and $t_n(k_x,k_y)$ is the acquisition time of the k-space sample $S_n(k_x,k_y)$ at $(k_x,k_y)$ for the nth echo. The k-space sampling pattern of the bipolar sequence shown in FIG. 2 is illustrated in FIG. 4, where a zigzag trajectory shows how the alternating readout gradients traverse along kx (the horizontal axis). The vertical axis in FIG. 4 corresponds to time, where ✳symbols mark the acquisition times $t_{1,2,3}$ of three k-space samples at $(k_x, k_y)$. Since this example only deals with Cartesian readouts, $k_y$ is fixed for each repetition. Asymmetric acquisition times have an implication of amplifying high-frequency noise in separated water/fat images in some cases.

The water and fat separation in k-space can then be done by solving the least-squares solution of Eq. 7 for $SW(k_x,k_y)$ and $SF(k_x,k_y)$:

$$\underbrace{\begin{pmatrix} \hat{S}_W(k_x, k_y) \\ \hat{S}_F(k_x, k_y) \end{pmatrix}}_{\hat{\Gamma}} = A^\dagger \begin{pmatrix} S_1(k_x, k_y) \\ S_2(k_x, k_y) \\ S_2(k_x, k_y) \end{pmatrix} \quad (8)$$

where $A^\dagger = (A^*A)^{-1}A^*$ and the superscript $*$ indicates conjugate transpose. Performing water and fat separation in k-space eliminates the phase factor $e^{i2\pi\Delta f TE_n}$ caused by the chemical shift $\Delta f$, which is the source of the chemical-shift induced misregistration $\Delta x_{cs}$. The separated water and fat images are the Fourier transforms of SW and SF, respectively.

Experimental Methods

Figure 10:
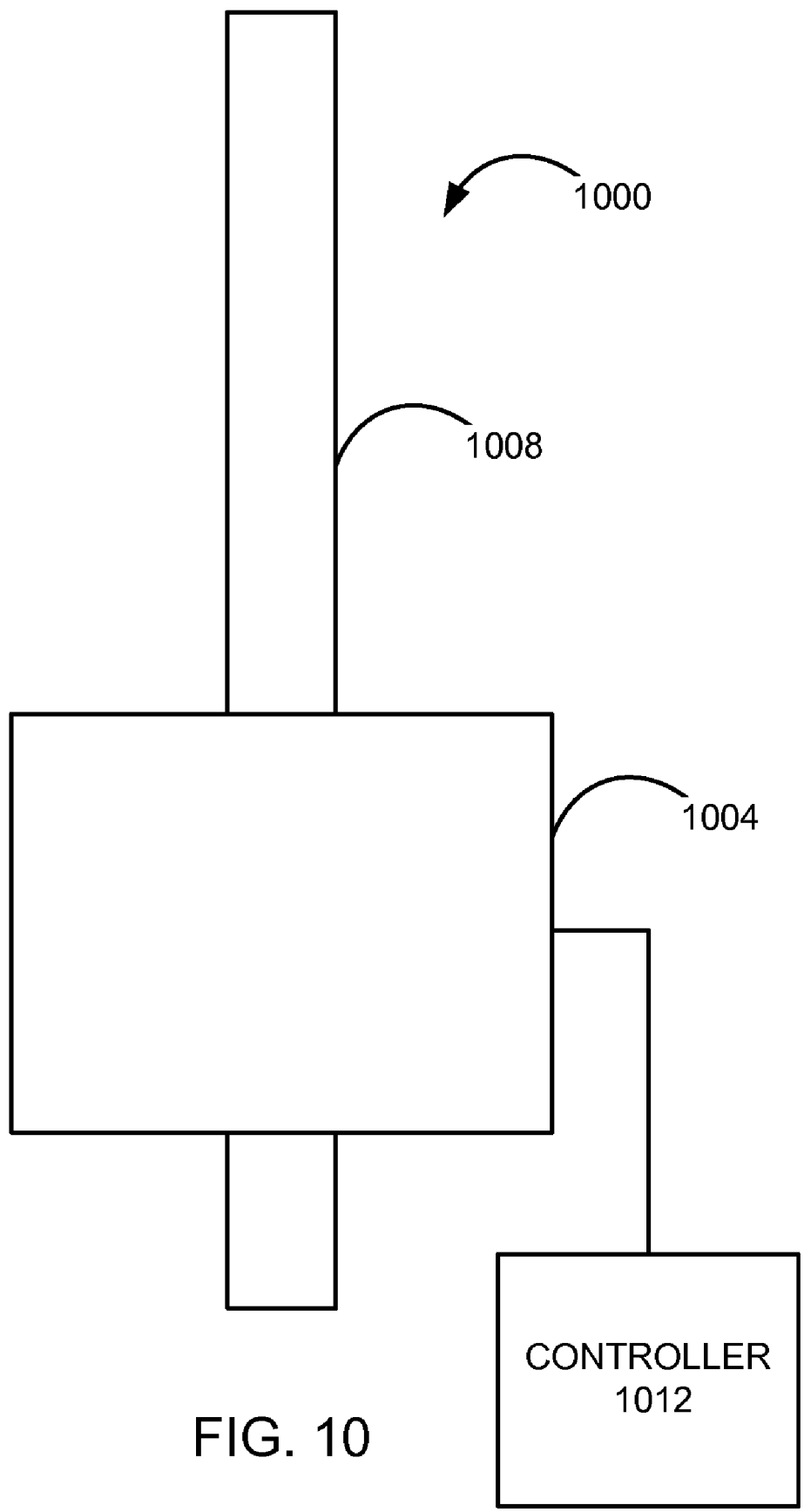
FIG. 10 is a schematic top view of a magnetic resonance imaging (MRI) system 1000 that may be used in an embodiment of the invention.

FIG. 10 is a schematic top view of a magnetic resonance imaging (MRI) system 1000 that may be used in an embodiment of the invention. The MRI system 1000 comprises a magnet system 1004, a patient transport table 1008 connected to the magnet system, and a controller 1012 controllably connected to the magnet system. In one example, a patient would lie on the patient transport table 1008 and the magnet system 1004 would pass around the patient. The controller 1012 would control magnetic fields and radio frequency (RF) signals provided by the magnet system 1004 and would receive signals from detectors in the magnet system 1004.

Figure 11A:
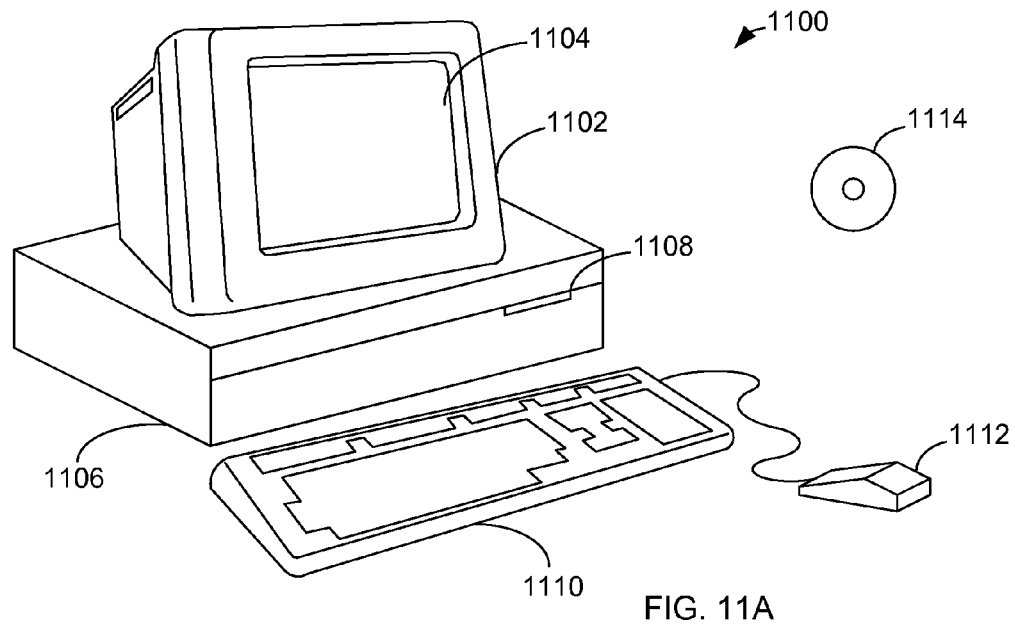
FIGS. 11A and 11B illustrate a computer system that may be used in an embodiment of the invention.
Figure 11B:
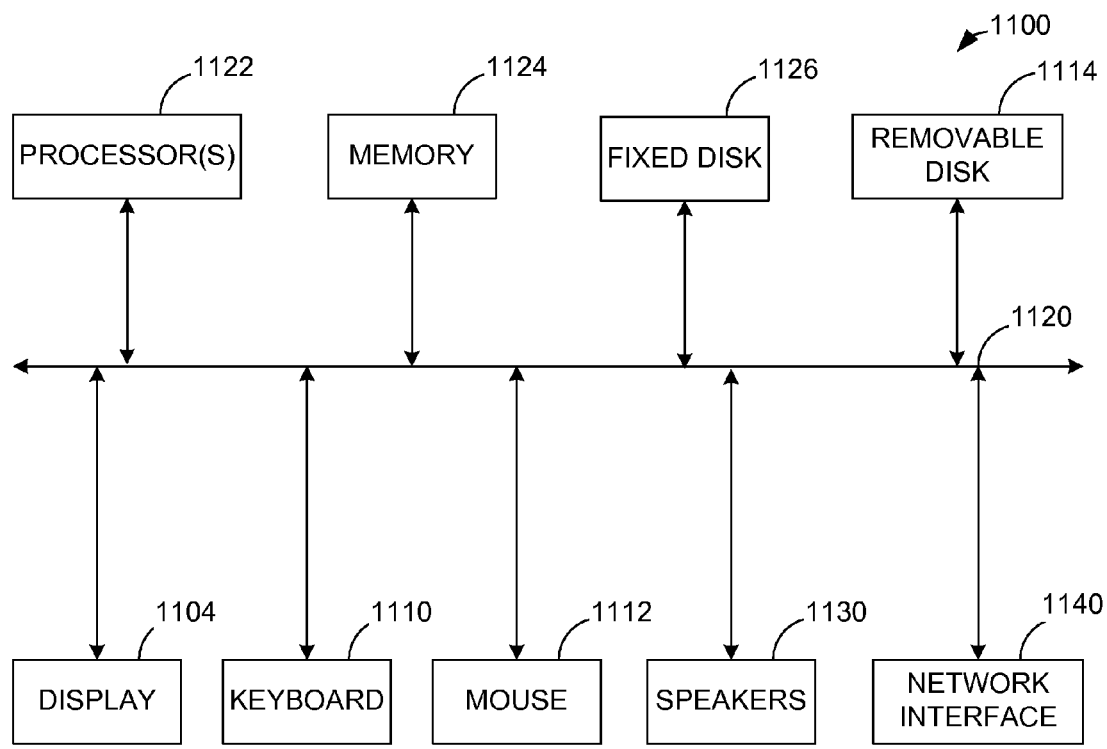

FIGS. 11A and 11B illustrate a computer system 1100, which is suitable for implementing a controller 1012 used in embodiments of the present invention. FIG. 11A shows one possible physical form of the computer system. Of course, the computer system may have many physical forms ranging from an integrated circuit, a printed circuit board, and a small handheld device up to a huge super computer. Computer system 1100 includes a monitor 1102, a display 1104, a housing 1106, a disk drive 1108, a keyboard 1110, and a mouse 1112. Disk 1114 is a computer-readable medium used to transfer data to and from computer system 1100.

FIG. 11B is an example of a block diagram for computer system 1100. Attached to system bus 1120 are a wide variety of subsystems. Processor(s) 1122 (also referred to as central processing units, or CPUs) are coupled to storage devices, including memory 1124. Memory 1124 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1126 is also coupled bi-directionally to CPU 1122; it provides additional data storage capacity and may also include any of the computer-readable media described below. Fixed disk 1126 may be used to store programs, data, and the like and is typically a secondary storage medium (such as a hard disk) that is slower than primary storage. It will be appreciated that the information retained within fixed disk 1126 may, in appropriate cases, be incorporated in standard fashion as virtual memory in memory 1124. Removable disk 1114 may take the form of the computer-readable media described below.

CPU 1122 is also coupled to a variety of input/output devices, such as display 1104, keyboard 1110, mouse 1112, and speakers 1130. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1122 optionally may be coupled to another computer or telecommunications network using network interface 1140. With such a network interface, it is contemplated that the CPU might receive information from the network, or might output information to the network in the course of performing the above-described method steps. Furthermore, method embodiments of the present invention may execute solely upon CPU 1122 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In this example, the controller 1012 may be used to generate and then display an image on the display 1104.

A bipolar multi-echo sequence, which acquires three echoes in each repetition with alternating readout gradients, was implemented at 1.5 T and 3 T GE scanners (GE Healthcare Technologies, Milwaukee, Wis., USA). The sequence was used to scan a water-oil phantom and healthy volunteers. The water-oil phantom is a bottle filled with tap water and vegetable oil, which was scanned at 1.5 T and 3 T with different cross-sectional views. For in vivo validation, volunteer data were acquired in two anatomical regions (liver and knee) with approval from the Institutional Review Board of Stanford and informed consent from each subject. Table 1 lists the relevant imaging parameters of the four studies. Methods for each study are given in more detail below.

TABLE 1

| Study | Phantom | Phantom | Kidney | Knee |
|---|---|---|---|---|
| Field Strength | 3 T | 1.5 T | 1.5 T | 1.5 T |
| TR (ms) | 10 | 13 | 13 | 12 |
| $TE_{1,2,3}$ (ms) | 3.6, 5.3, 7 | 3.8, 7, 10.2 | 3.5, 6.7, 9.8 | 3.4, 5.6, 7.8 |
| Bandwidth (kHz) | ±83.3 | ±41.5 | ±41.5 | ±62.5 |
| $BW_{pixel}$ (Hz/pixel) | 650 | 320 | 320 | 488 |
| FOV (cm³) | 12 × 12 × 3 | 24 × 24 × 6 | 40 × 22 × 4 | 20 × 20 × 5 |
| Matrix | 256 × 256 × 64 | 256 × 256 × 64 | 256 × 144 × 28 | 256 × 256 × 64 |

Phantom study at 3 T: The phantom was scanned at 3 T with a quadrature extremity coil (Medical Advances, Milwaukee, Wis., USA) and the following imaging parameters: $TE_{1,2,3}$=3.6,5.3,7 ms, acquisition matrix 256×256×64, field-of-view (FOV) 12×12×3 cm³, receiver bandwidth ±83.3 kHz (BWpixel=650 Hz/pixel), TR=10 ms, and flip angle of 30°. In this study a large offset (980 Hz) was also applied to the receiver center frequency. The large frequency offset simulated the field-inhomogeneity induced misregistration in an extreme case.

Phantom study at 1.5 T: The phantom was scanned at 1.5 T with a quadrature head coil (Medical Advances) and the following imaging parameters: $TE_{1,2,3}$=3.8,7,10.2 ms, acquisition matrix 256×256×64, FOV=24×24×6 cm³, receiver bandwidth ±41.5 kHz (BWpixel=320 Hz/pixel), TR=13 ms, and flip angle of 30°.

Abdominal study at 1.5 T: As the bipolar multi-echo sequence greatly reduces scan times, one application is abdominal imaging with reduced breath-hold duration. The bipolar multi-echo sequence was used to scan the kidney of a healthy volunteer at 1.5 T. An 8-channel coil was used with the following imaging parameters: $TE_{1,2,3}$=3.5,6.7,9.8 ms, acquisition matrix 256×144×28 with phase FOV ratio 0.75, FOV=40×22×4 cm³, receiver bandwidth ±41.5 kHz (BWpixel=320 Hz/pixel), TR=13 ms, and flip angle of 30°. For this 3D kidney study, the data from each coil was processed separately using the proposed methods, and the separated water/fat images of multiple coils were then combined based on the corresponding coil sensitivity.

Knee study at 1.5 T: The knee of a healthy volunteer was scanned at 1.5 T with an extremity coil (Medical Advances) and the following imaging parameters: $TE_{1,2,3}$=3.4,5.6,7.8 ms, acquisition matrix 256×256×64, FOV=20×20×5 cm³, receiver bandwidth ±62.5 kHz (BWpixel=488 Hz/pixel), TR=12 ms, and flip angle of 30°.

Water-fat separation was performed for all four studies using the proposed methods implemented in Matlab (Mathworks, Natick, Mass., USA). The separated water/fat images from the proposed methods and an existing multi-point separation method are presented in the following section.

Results

Figure 6:
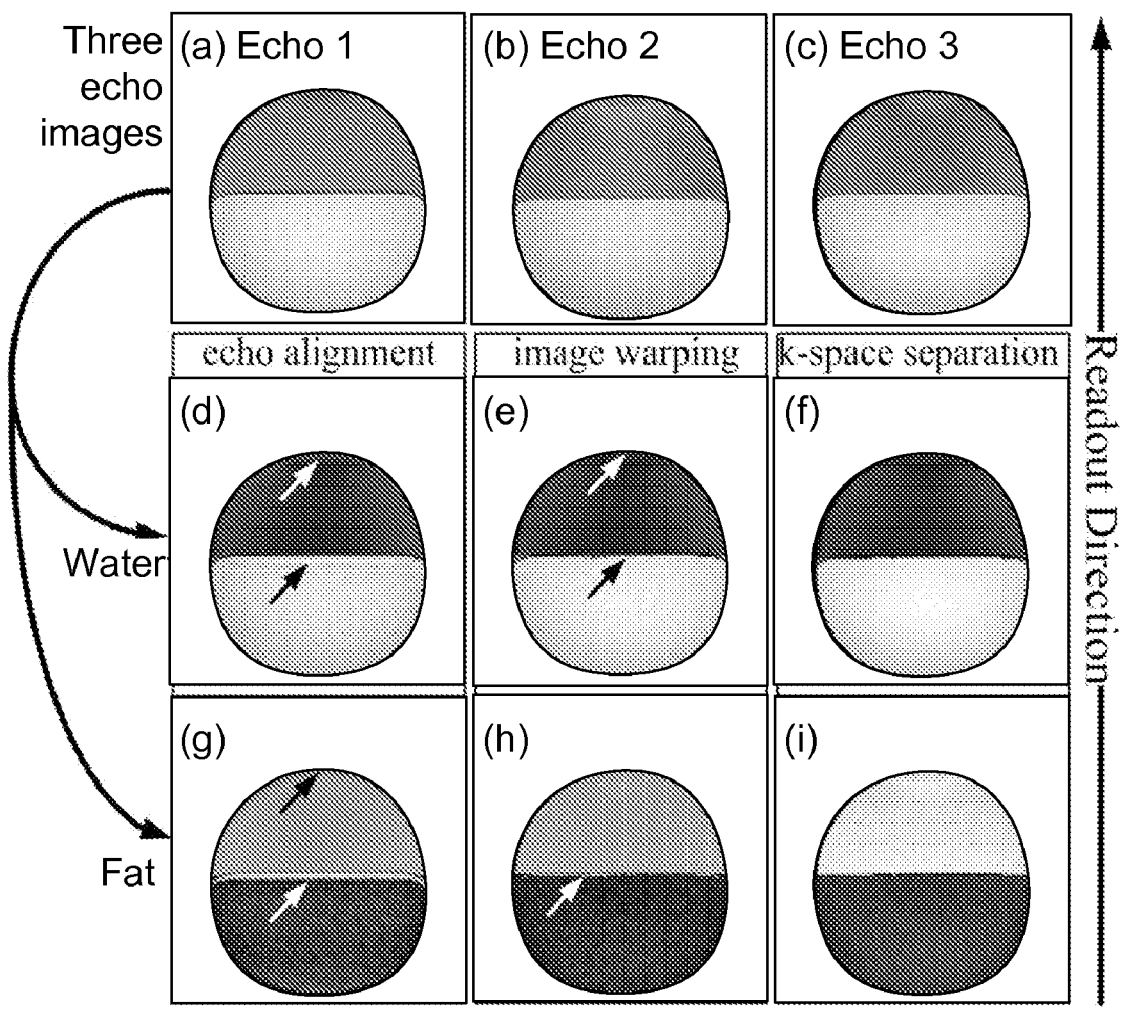
FIGS. 6a-i show the three echo images and corrections.

The water-oil phantom study at 3 T serves as a detailed example to illustrate the utility of the proposed methods. FIGS. 6a-c show the three echo images for three echo scans, where the first and third scan are in the same direction and the second scan is in the opposite direction. FIGS. 6d-f show separated water images. FIGS. 6g-i show separated fat images. By comparing the second echo image, FIG. 6b, with the odd echo images, FIGS. 6a and c, it can be seen that the purposefully applied 980 Hz center-frequency offset leads to an approximately 3-pixel shift (i.e., $2\Delta x_{fm}$) between the even and odd echo images, and the 440 Hz chemical shift results in an approximately 1.35-pixel relative shift (i.e., $2\Delta x_{cs}$) between water and fat across the echoes. After correcting the k-space echo misalignment, direct application of a separation method, such as a method described in Reeder S B, Pineda A R, Wen Z, Shimakawa A, Yu H, Brittain J H, Gold G E, Beaulieu C H, and Pelc N J, "Iterative Decomposition of Water and Fat with Echo Asymmetry and Least-Squares Estimation IDEA: Application with Fast Spin-Echo Imaging," in Magn. Reson. Med. 2005; 54:636-644, which is incorporated by reference, generated separated water/fat images, but with severe artifacts which are noted by arrows in FIGS. 6d and g. Subsequently, the even and odd echo images were resampled using the image-warping procedure, followed by applying a separation method. FIGS. 6e and h show that the re-sampling effectively suppressed the artifacts caused by $\Delta x_{fm}$, while the artifacts due to $\Delta x_{cs}$ still persist at the boundaries and the water-fat interface (noted by arrows). Finally, the re-sampled image data were fed into the k-space water-fat separation method. FIGS. 6f and i show that this example of the invention produced reliable water-fat separation with successful elimination of the remaining artifacts due to chemical-shift induced misregistration.

Figure 7:
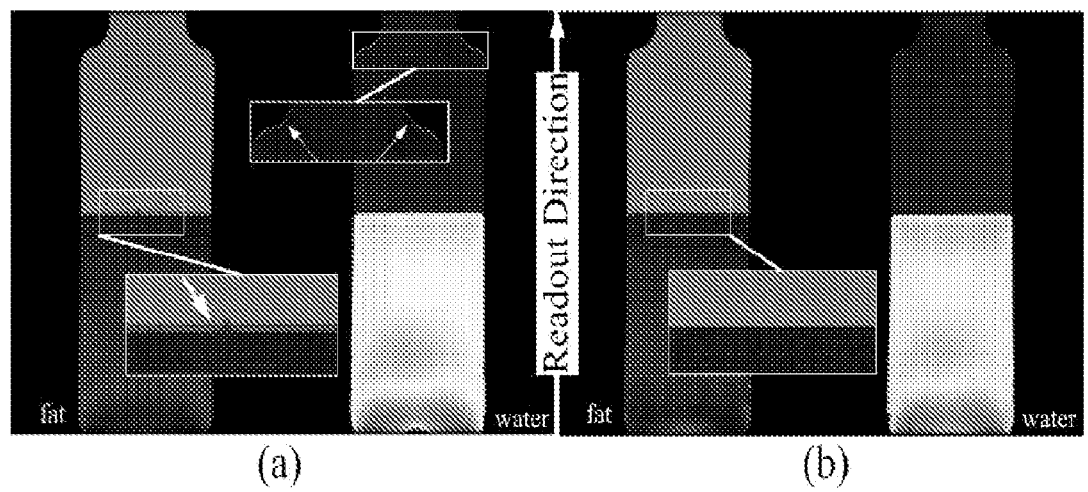
FIGS. 7a-b show a phantom study.
Figure 8:
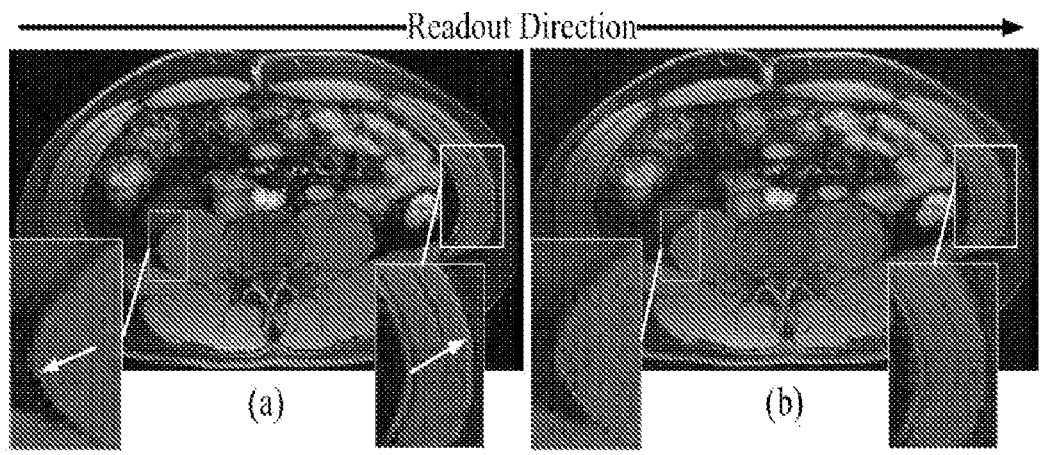
FIGS. 8a-b show a kidney study.

In the following of this section, the separated water images obtained from the existing method and the proposed methods are compared, assuming that the k-space echo misalignment has been corrected for all cases. FIGS. 7a-b and 8a-b show the phantom study and the kidney study at 1.5 T. FIG. 7a and FIG. 8a identify the artifacts in the separated water images with arrows, while FIG. 7b and FIG. 8b show an example embodiment of the invention successfully eliminated the artifacts and achieved reliable water-fat separation.

Figure 9:
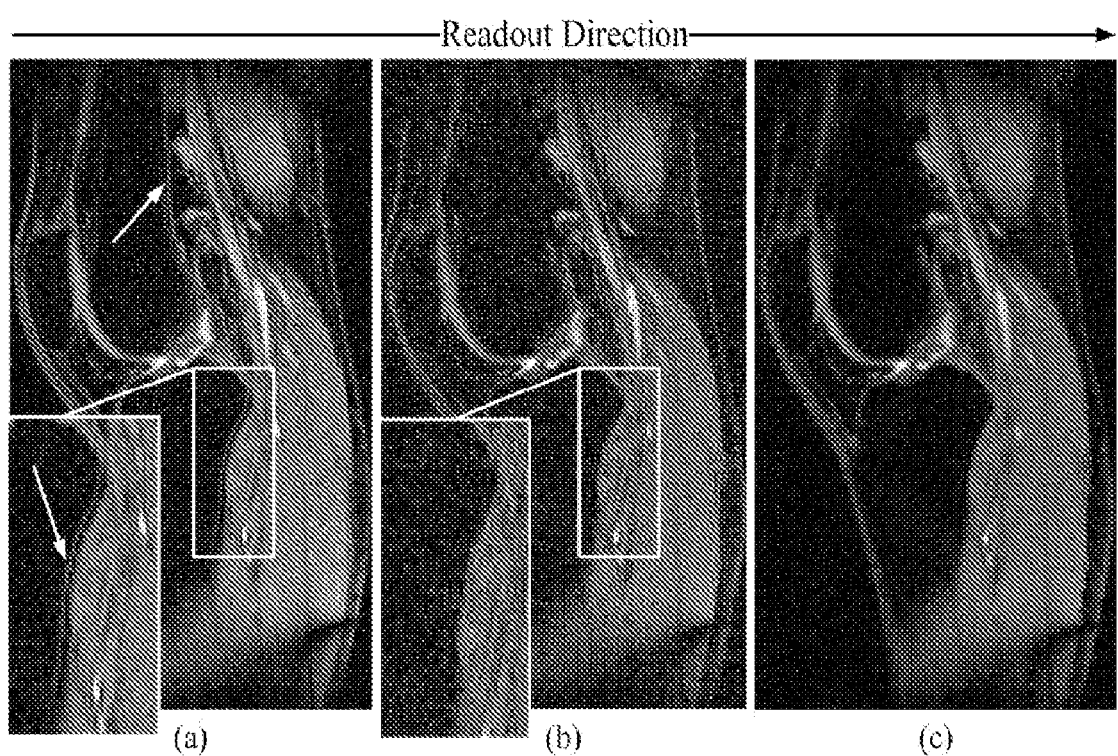
FIGS. 9a-c show separated water images of a knee study at 1.5 T.

The separated water images of the knee study at 1.5 T shown in FIGS. 9a-c demonstrates a case when an apodization window is needed. As compared to the water image obtained from the existing separation method FIG. 9a, the proposed methods suppressed the artifacts due to the field-inhomogeneity and chemical-shift induced misregistrations, but with a fair amount of high-frequency noise. The high-frequency noise present in FIG. 9b was suppressed by applying the apodization window shown in FIG. 5 to the k-space water samples (Eq. 8) along the readout direction, as shown in FIG. 9c. Nevertheless, the apodization also causes a small loss of edge sharpness.

Figure 5:
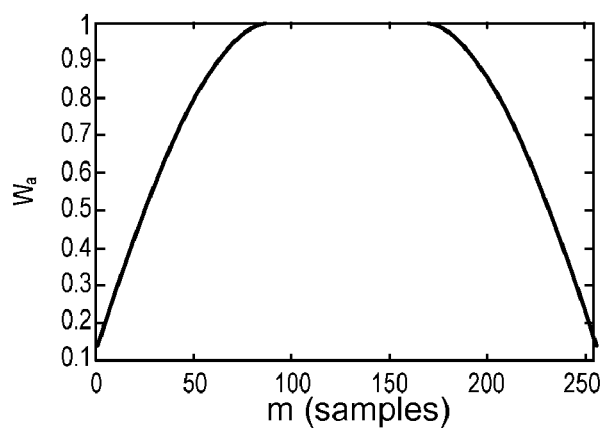
FIG. 5 illustrates a sample apodization window that is applied to separated k-space water/fat samples along the readout direction.

FIG. 5 illustrates a sample apodization window that is applied to separated k-space water/fat samples along the readout direction, as asymmetric acquisition times may cause noise to overwhelm signal in high-frequency regions.

Discussion

This example of the invention enables highly SNR efficient water-fat separation with bipolar multi-echo sequences. Replacing fly-back gradients with alternating readout gradients greatly reduces the echo-spacing and the repetition interval in bipolar multi-echo sequences. However, the alternating readout gradients cause several technical problems, which prevent direct application of existing multi-point water-fat separation methods. An example of the invention provides a post-processing method that shifts the k-space data to correct the k-space echo misalignment, an image warping method that utilizes a low-resolution field map to remove the field inhomogeneity induced misregistration, and a k-space separation method that eliminates the chemical-shift induced artifacts in separated water/fat images. The three methods in this example are applied sequentially to achieve reliable water-fat separation without artifacts. However, in some cases a fair amount of high-frequency noise presents in separated water/fat images. The apodization window of FIG. 5 may be used to suppress such high frequency noise. Below, it will be shown that the high-frequency noise is an undesired by-product of asymmetric acquisition times.

The signal model in Eq. 7 can be extended by including a noise vector n:

$$S+n==A\Gamma \quad (9)$$

where we assume that the vector n models acquisition errors as zero-mean white Gaussian noise; i.e., n~N(0,Σ). The covariance matrix Σ is given by $\sigma^2 I$, where $\sigma^2$ is the variance of each element in n and I is an identity matrix. The effect of the noise vector n on the least-squares solution $\hat{\Gamma}$ (Eq. 8) can be accounted for by a noise amplification factor η, which is defined as follows:

$$\eta = \frac{tr(A^\dagger \sum (A^\dagger)^*)/2}{\sigma^2/3} \quad (10)$$

where the numerator is the variance of the noise present in the least-squares solution, and the denominator is the lowest noise variance that can be achieved with the three-point acquisition. Specifically, $A^\dagger \Sigma (A^\dagger)^*$ is the covariance matrix of the white Gaussian noise after the pseudo-inverse. By taking the average of the trace of the covariance matrix, the variance of the noise is in separated k-space water (or fat) sample is obtained. On the other hand, the lowest achievable noise variance can be obtained when only one species (water or fat) exists and the estimate is the average of the three k-space samples; hence, η>1. After some algebraic manipulation, the factor η can be computed explicitly by $$\frac{3}{2} tr((A^*A)^{-1}),$$

where the matrix A (Eq. 7) depends on the acquisition times $t_{1,2,3}$.

Figure 12A:
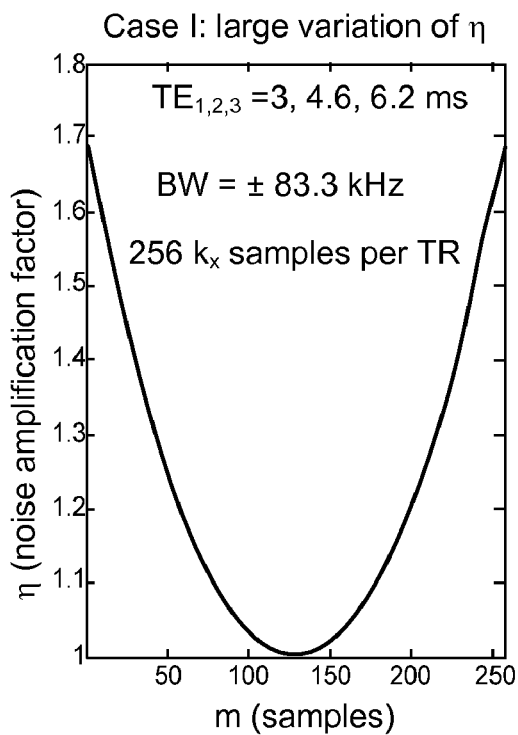
FIGS. 12*a-b* show the variation of the noise amplification factor η in two imaging cases.
Figure 12B:
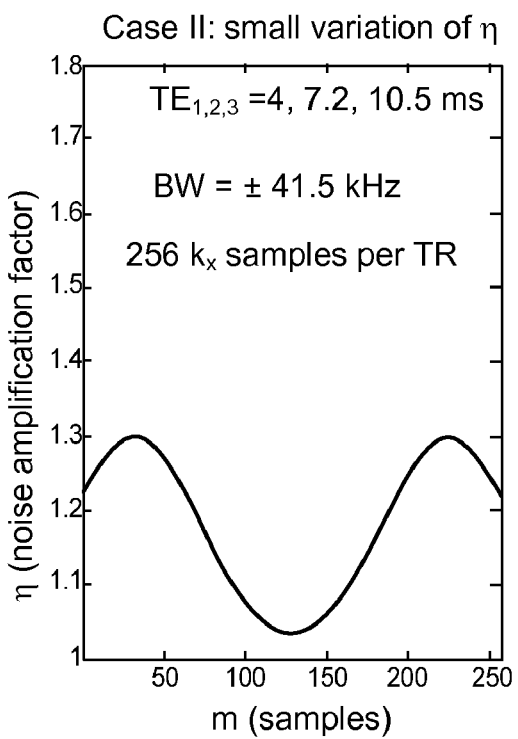

With reference to the sampling example shown in FIG. 4 (illustrated with a dotted line), the acquisition times $t_{1,2,3}$ of three k-space samples at $(k_x, k_y)$ are placed in an asymmetric pattern. That is, $t_3 - t_2 \neq t_2 - t_1$ except at $k_x = 0$. Given the acquisition times $t_{1,2,3}$ at each k-space location, the noise amplification factor η of the corresponding matrix A can be computed. FIGS. 12a-b show the variation of the noise amplification factor η in two imaging cases. The relevant imaging parameters that determine the acquisition times are: $TE_{1,2,3} = 3$, 4.6, 6.2 ms, receiver bandwidth 83.3 kHz in Case I, and $TE_{1,2,3} = 4$, 7.2, 10.5 ms, receiver bandwidth 41.5 kHz in Case II. For both cases, there are 256 $k_x$ samples per TR. It can be seen that the asymmetric acquisition times result in different noise amplification factors for different $k_x$ locations.

In Case I high-frequency noise is greatly amplified in separated images. Intuitively, the amplification of high-frequency noise is due to insufficient water-fat phase difference developed at the boundary of the zig-zag trajectory. The small difference between two adjacent acquisitions leads to a poor condition of the matrix A for separating k-space samples in high-frequency regions. In contrast, the lower receiver bandwidth in Case II results in better condition of the matrix A, and hence smaller variation of the factor η for different $k_x$ locations. However, high receiver bandwidth (e.g., 83.3 kHz in Case I) is often needed in many time-sensitive applications, such as abdominal imaging that requires a breath-hold. In such cases when noise overwhelms signal at high-frequency regions, suppressing the amplified high-frequency noise requires an "optimal" apodization window. The apodization window of FIG. 5 was found to generally provide a good tradeoff between suppressing high-frequency noise and maintaining image details.

CONCLUSION

Compared to standard multi-echo sequences with fly-back gradients, bipolar multi-echo sequences significantly reduce the echo-spacing (ΔTE) and the repetition interval (TR). Shortened ΔTE and TR offer many attractive advantages, such as more robust field map estimation, improved SNR efficiency, higher spatial resolution, reduced motion-induced artifacts, and shorter scan time. Therefore, bipolar multi-echo sequences will enable many applications of great interest. For example, robust field map estimation at 3 T requires much shorter echo-spacing than that at 1.5 T. In this case bipolar multi-echo sequences can provide short echo-spacings without necessitating high receiver bandwidth or low spatial resolution. In addition, the reduced repetition interval results in very fast imaging sequences, which will enable breath-hold scanning and rapid dynamic-contrast-enhanced (DCE) imaging, where standard multi-echo sequences with fly-back gradients are too slow.

The proposed methods enable highly SNR efficient and reliable water-fat separation with bipolar multi-echo sequences, and provide a basic framework, based on which many variations can be implemented. For example, bipolar multi-echo sequences can be incorporated with different contrast types, such as GRE, SPGR, FIESTA, spin-echo, and fast spin-echo (FSE). An example of the invention may be used to separate three or more chemical species (for example, water, fat, and silicon) by increasing the number of echoes acquired per TR. When multiple coils are used, the proposed methods can be implemented for each individual coil, followed by the summation of the resulting images. Parallel imaging can be implemented with bipolar multi-echo sequences to achieve even shorter scan times. In one example, parallel reconstruction is performed prior to the proposed methods for water-fat separation.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for magnetic resonance imaging (MRI), comprising:
    a) applying a magnetic resonance excitation in a MRI apparatus, comprising an imaging excitation and detection system and a controller, which controls the imaging excitation and detection system;
    b) acquiring a plurality of k-space echoes bi-directionally wherein at least one echo is an even echo acquired in a first direction and at least one echo is an odd echo acquired in a second direction opposite from the first direction, in the imaging excitation and detection system;
    c) correcting k-space echo realignment between the even and odd echoes in the controller;
    d) correcting field inhomogeneity induced artifacts in the controller;
    e) simultaneously correcting chemical shift induced artifacts between at least two species in the controller; and
    f) generating an image using the correction k-space echo realignment, correction field inhomogeneity, and correction chemical shift in the controller.

2. The method, as recited in claim 1, wherein the correcting chemical shift induced artifacts is performed in k-space.

3. The method, as recited in claim 2, wherein the correcting the k-space echo realignment is performed in k-space.

4. The method, as recited in claim 3, wherein the correcting field inhomogeneity is performed in image space.

5. The method, as recited in claim 4, wherein the plurality of echoes is at least three echoes.

6. The method, as recited in claim 4, wherein the plurality of echoes is at least four echoes.

7. The method, as recited in claim 4, further comprising applying an apodization window.

8. The method, as recited in claim 4, further comprising flipping the even echoes or flipping the odd echoes, but not both.

9. The method, as recited in claim 4, wherein the correcting the k-space echo realignment comprises searching for an optimal gradient of a linear phase ramp.

10. The method, as recited in claim 4, further comprising generating a k-space echo realignment corrected, field inhomogeneity corrected, and chemical shift corrected image.

11. The method of claim 1, wherein the acquiring the same k-space echoes bi-directionally acquires the same k-space locations at multiple times with the purpose of separating multiple species with different resonances.

12. A method for magnetic resonance imaging (MRI), comprising:
    a) applying a magnetic resonance excitation in a MRI apparatus, comprising an imaging excitation and detection system and a controller, which controls the imaging excitation and detection system;
    b) acquiring a plurality of k-space echoes bi-directionally wherein at least one echo is an even echo acquired in a first direction and at least one echo is an odd echo acquired in a second direction opposite from the first direction, in the imaging excitation and detection system;
    c) correcting k-space echo realignment between the even and odd echoes in the controller, wherein the correcting the k-space echo realignment is performed in k-space, wherein the correcting the k-space echo realignment comprises performing a one-dimensional search algorithm to minimize a cross-correlation coefficient;
    d) correcting field inhomogeneity induced artifacts in the controller, wherein the correcting field inhomogeneity is performed in image space;
    e) correcting chemical shift induced artifacts between at least two species in the controller, wherein the correcting chemical shift induced artifacts is performed in k-space; and
    f) generating an image using the correction k-space echo realignment in the controller, correction field inhomogeneity, and correction chemical shift.

13. The methods, as recited in claim 12, wherein the correcting field inhomogeneity comprises:

low-pass filtering k-space data to obtain a low-resolution image data;

obtaining a field map from the low-resolution image data; and using the field map to remove effects due to field inhomogeneities.

14. The method, as recited in claim 13, wherein the correcting chemical shift induced artifacts between at least two species, comprises:

performing a species separation in k-space; and performing separate Fourier transforms for each species separated in k-space to transform each k-space function for each species from k-space to image space.

15. A method for magnetic resonance imaging (MRI), comprising:

a) applying a magnetic resonance excitation in a MRI apparatus, comprising an imaging excitation and detection system and a controller, which controls the imaging excitation and detection system;

b) acquiring a plurality of k-space echoes bi-directionally, in the imaging excitation and detection system, wherein at least one echo is an even echo acquired in a first direction and at least one echo is an odd echo acquired in a second direction opposite from the first direction;

c) correcting k-space echo realignment between the even and odd echoes in the controller, wherein the correcting the k-space echo realignment is performed in k-space;

d) correcting field inhomogeneity induced artifacts in the controller, wherein the correcting field inhomogeneity is performed in image space;

e) correcting chemical shift induced artifacts between at least two species in the controller, wherein the correcting chemical shift induced artifacts is performed in k-space;

f) separating a number of species more than two species, wherein the number of the plurality of echoes is at least the number of species in the controller; and g) generating an image using the correction k-space echo realignment, correction field inhomogeneity, and correction chemical shift in the controller.

16. A magnetic resonance imaging apparatus, comprising:

a magnetic resonance imaging excitation and detection system; and a controller electrically connected to the magnetic resonance imaging excitation and detection system, comprising:

a display;

at least one processor; and computer readable media, comprising:

computer readable code for applying a magnetic resonance excitation;

computer readable code for acquiring a plurality of k-space echoes bi-directionally wherein at least one echo is an even echo acquired in a first direction and at least one echo is an odd echo acquired in a second direction opposite from the first direction;

computer readable code for correcting k-space echo realignment between the even and odd echoes;

computer readable code for correcting field inhomogeneity induced artifacts; and computer readable code for simultaneously correcting chemical shift induced artifacts between at least two species.

17. The apparatus, as recited in claim 16, wherein the computer readable code for correcting chemical shift induced artifacts comprises computer readable code for performing the correction in k-space.

18. The apparatus, as recited in claim 17, wherein the computer readable code for correcting the k-space echo realignment comprises computer readable code for performing the correction in k-space.

19. The apparatus, as recited in claim 18, wherein the computer readable code for correcting field inhomogeneity comprises computer readable code for performing the correction in image space.

* * * * *